(12) United States Patent
Liang

(10) Patent No.: US 10,326,422 B2
(45) Date of Patent: Jun. 18, 2019

(54) PARAMETER PROCESSING METHOD, AUDIO SIGNAL PLAYING METHOD AND DEVICE, AND AUDIO EQUALIZER

(71) Applicant: CHINA ACADEMY OF TELECOMMUNICATIONS TECHNOLOGY, Beijing (CN)

(72) Inventor: Min Liang, Beijing (CN)

(73) Assignee: CHINA ACADEMY OF TELECOMMUNICATIONS TECHNOLOGY, Beijing (CN)

(*) Notice: Subject to any disclaimer, the term of this patent is extended or adjusted under 35 U.S.C. 154(b) by 0 days.

(21) Appl. No.: 15/762,407

(22) PCT Filed: Aug. 26, 2016

(86) PCT No.: PCT/CN2016/096881
§ 371 (c)(1),
(2) Date: Mar. 22, 2018

(87) PCT Pub. No.: WO2017/050089
PCT Pub. Date: Mar. 30, 2017

(65) Prior Publication Data
US 2018/0302055 A1   Oct. 18, 2018

(30) Foreign Application Priority Data
Sep. 25, 2015 (CN) .......................... 2015 1 0624803

(51) Int. Cl.
*H03G 5/00* (2006.01)
*H03G 5/16* (2006.01)
(Continued)

(52) U.S. Cl.
CPC ............. *H03G 5/165* (2013.01); *G06F 16/00* (2019.01); *H03G 5/005* (2013.01); *H03H 17/02* (2013.01)

(58) Field of Classification Search
CPC ........ H03G 5/165; H03G 5/005; H03H 17/02; G06F 16/00
See application file for complete search history.

(56) References Cited

U.S. PATENT DOCUMENTS 4,453,255 A * 6/1984 Tsuchikane ............ G11B 5/035
                                                             333/18
8,973,112 B2   3/2015 Golobay
(Continued)

FOREIGN PATENT DOCUMENTS

CN    101136896 A    3/2008
CN    102447445 A    5/2012
(Continued)

OTHER PUBLICATIONS

Office Action dated Jun. 26, 2018 for Chinese Patent Application No. 201510624803.9 and its English translation provide by Applicant's foreign council.
(Continued)

*Primary Examiner* — Andrew L Sniezek
(74) *Attorney, Agent, or Firm* — Ladas & Parry, LLP

(57) ABSTRACT

A parameter processing method, an audio signal playing method and device of an audio equalizer, and an audio equalizer are provided. The parameter processing method includes: acquiring a current parameter preset set and a predetermined target parameter preset set of the audio equalizer, linearly processing at least a part of parameters in the current parameter preset set, to enable the parameters processed linearly to be identical to target parameters in the target parameter preset set.

14 Claims, 11 Drawing Sheets

(51) Int. Cl.
  *G06F 16/00* (2019.01)
  *H03H 17/02* (2006.01)

(56) References Cited

U.S. PATENT DOCUMENTS

| | | | |
|---|---|---|---|
| 2008/0175420 | A1 | 7/2008 | Chung et al. |
| 2010/0166222 | A1 | 7/2010 | Bongiovi et al. |
| 2010/0180325 | A1 | 7/2010 | Golobay |
| 2012/0300831 | A1 | 11/2012 | Luo et al. |
| 2013/0163646 | A1 | 6/2013 | Lai et al. |
| 2014/0369519 | A1 | 12/2014 | Leschka et al. |
| 2016/0036404 | A1* | 2/2016 | Fleischmann .......... H03G 5/165 381/103 |

FOREIGN PATENT DOCUMENTS

| | | |
|---|---|---|
| CN | 103295611 A | 9/2013 |
| CN | 103473005 A | 12/2013 |
| CN | 104090880 A | 10/2014 |
| TW | 201328261 A | 7/2013 |
| TW | I501572 B | 9/2015 |
| WO | 2014/128279 A1 | 8/2018 |

OTHER PUBLICATIONS

International Preliminary Report on Patentability (Chapter I) for PCT/CN2016/096881 dated Mar. 27, 2018 and its English translation from WIPO.
International Search Report for PCT/CN2016/096881 dated Nov. 25, 2016 and its English translation provided by WIPO.
Written Opinion of the International Search Authority PCT/CN2016/096881 dated Nov. 25, 2016 and its English translation provided by Google Translate.
From TW-105129933 Office Action dated Aug. 17, 2018, with machine translation by client.

\* cited by examiner

PARAMETER PROCESSING METHOD, AUDIO SIGNAL PLAYING METHOD AND DEVICE, AND AUDIO EQUALIZER

CROSS-REFERENCE TO RELATED APPLICATIONS

The present application is the U.S. national phase of PCT Application PCT/CN2016/096881 filed on Aug. 26, 2016 which claims the priority to Chinese patent application No. 201510624803.9 filed on Sep. 25, 2015, the disclosures of which are incorporated herein by reference in their entireties.

TECHNICAL FIELD

The present disclosure relates to the field of parameter processing of an audio equalizer, and in particular to a parameter processing method, an audio signal playing method and device of an audio equalizer, and an audio equalizer.

BACKGROUND

An audio equalizer (AEQ) is commonly configured to enhance or weaken different frequency components of an audio signal, so as to adjust a tone of the audio signal according to auditory preferences of a user, thereby improving the user's auditory experience. A parametric digital AEQ is equivalent to a high-order IIR digital filter in terms of principle, and its frequency response is determined only based on a transfer function of the high-order digital filter. At a landmark of DSP, a quantization error of a filter factor may make an actual frequency response of an AEQ landmark model to deviate from the design principle. In view of this, the above high-order IIR filter may be divided into a plurality of low-order filters (including a biquad filter and/or a double first-order filter) connected in series, and the overall structure thereof is shown in FIG. 1. In terms of mathematics, the AEQ may be represented as a high-order IIR filter with the following transfer function:

$$H_{AEQ}(z) = \frac{\sum_{k=0}^{M} b_k z^{-k}}{1 + \sum_{k=0}^{N} a_k z^{-k}}; \quad (1),$$

$N \geq M$, and $\{b_k\}$ and $\{a_k\}$ are filter factors.

The above formula may be decomposed as:

$$H_{AEQ}(Z) = \Pi_{k=1}^{R} H_k(z) \quad (2)$$

R is the integer part of $(N+1)/2$, $H_k(Z)$ is a $k_{th}$-stage low-order filter. In the case that the filter is implemented based on an all-pass filter structure, the transfer function may be represented as:

$$H_k(z) = \begin{cases} F_{kg} \cdot \frac{a_{k0} + a_{k1} \cdot z^{-1} + z^{-2}}{1 + a_{k1} \cdot z^{-1} + a_{k0} \cdot z^{-2}} + B_{kg}, & \text{in the case that } a_{k0} \neq 0 \\ F_{kg} \cdot \frac{a_{k1} + z^{-1}}{1 + a_{k1} \cdot z^{-1}} + B_{kg}, & \text{in the case that } a_{k0} = 0 \end{cases} \quad (3)$$

$\{a_{ki}, i=0, 1\}$ is an all-pass filter factor in the $k_{th}$ stage, and $\{B_{kg}, F_{kg}\}$ are respectively a gain of a bypass branch and a gain of a filter branch of the $k_{th}$-stage filter.

The $k_{th}$-stage low-order filter defined by the above formula (3) has a structure shown in FIG. 2.

A parameter set $\{a_{k0}, a_{k1}, B_{kg}, F_{kg}, k=1, 2, \ldots, R\}$ of all the low-order filters forms a parameter preset of the AEQ which defines a system frequency response curve of the AEQ.

In the related art, when playing the audio signal, a noise sound like "Click" may occur when switching the preset set of the AEQ, which may makes the user uncomfortable.

SUMMARY

The present disclosure is to provide a parameter processing method, an audio signal playing method and device of an audio equalizer, and an audio equalizer, so as to avoid a noise sound like "Click" when switching the parameter preset set of the audio equalizer during playing the audio signal, thereby improving the user experience.

A parameter processing method of an audio equalizer is provided in the present disclosure, including: acquiring a current parameter preset set and a predetermined target parameter preset set of the audio equalizer; linearly processing at least a part of parameters in the current parameter preset set, to enable the parameters processed linearly to be identical to target parameters in the target parameter preset set.

Optionally, the linearly processing at least a part of parameters in the current parameter preset set, includes: linearly increasing and/or linearly decreasing the part of parameters in the current parameter preset set, to enable the parameters processed linearly to be identical to the target parameters in the target parameter preset set.

Optionally, the linearly increasing and/or linearly decreasing the part of parameters in the current parameter preset set, to enable the parameters processed linearly to be identical to the target parameters in the target parameter preset set, includes: linearly changing a current gain of a filter branch of a $k_{th}$-stage filter of the audio equalizer in the current parameter preset set to a first value, and linearly changing a current gain of a bypass branch of the $k_{th}$-stage filter of the audio equalizer of the current parameter preset set to a second value; replacing an all-pass filter factor of the $k_{th}$-stage filter in the current parameter preset set with a target all-pass filter factor in the target parameter preset set; and linearly changing the current gain of the filter branch of the $k_{th}$-stage filter from the first value to a first target value in the target parameter preset set, and linearly changing the current gain of the bypass branch of the $k_{th}$-stage filter from the second value to a second target value in the target parameter preset set, where $k=1, \ldots, R$, R is a total number of stages of low-orders filters of the audio equalizer.

Optionally, the first value is 0.

Optionally, the second value is an arbitrary constant.

Optionally, the second value is obtained through the following formula:

$$FLAT_k = \begin{cases} \min[G_{kmax|current}, G_{kmax|target}], & \text{if } G_{kmax|current} > G_{kmin|current} \text{ and } \\ & G_{kmax|target} > G_{kmin|target} \\ \max[G_{kmax|current}, G_{kmax|target}], & \text{otherwise} \end{cases}$$

where $FLAT_k$ is the second value, $G_{kmax|current}$ is a current gain of a center frequency point of the $k_{th}$-stage filter of the audio equalizer, $G_{kmax|target}$ is a target gain of the center frequency point of the $k_{th}$-stage filter of the audio equalizer, $G_{kmin|current}$ is a current frequency response curve reference gain of the $k_{th}$-stage filter of the audio equalizer, and $G_{kmin|target}$ is a target frequency response curve reference gain of the $k_{th}$-stage filter of the audio equalizer.

Optionally, in the case that the $k_{th}$-stage filter is a first structural filter or a second structural filter, $G_{kmax}=B_{kg}-F_{kg}$ and $G_{kmin}=B_{kg}+F_{kg}$; or in the case that the $k_{th}$-stage filter is a third structural filter, $G_{kmax}=B_{kg}+F_{kg}$ and $G_{kmin}=B_{kg}-F_{kg}$; where $G_{kmax}$ is a gain of the center frequency point of the $k_{th}$-stage filter, $G_{kmin}$ is a frequency response curve reference gain of the $k_{th}$-stage filter, $F_{kg}$ is a gain of the filter branch of the $k_{th}$-stage filter, and $B_{kg}$ is a gain of the bypass branch of the $k_{th}$-stage filter.

Optionally, the linearly changing the current gain of the filter branch of the $k_{th}$-stage filter of the audio equalizer in the current parameter preset set to the first value, includes: linearly changing the current gain of the filter branch of the $k_{th}$-stage filter of the audio equalizer to the first value, through the following determination process: if $F_{kg}$−rampStep1>0, $F_{kg}=F_{kg}$−rampStep1; else if, $F_{kg}$+rampStep1<0, $F_{kg}=F_{kg}$+rampStep1; else, $F_{kg}=0$; where $F_{kg}$ is a gain of the filter branch of the $k_{th}$-stage filter, and rampStep1 is a step size of the linearly changing.

Optionally, the linearly changing the current gain of the bypass branch of the $k_{th}$-stage filter to the second value, includes: linearly changing the current gain of the bypass branch of the $k_{th}$-stage filter to the second value, through the following determination process: if $B_{kg}$−rampStep2>$FLAT_k$, $B_{kg}=B_{kg}$−rampStep2; else if, $B_{kg}$+rampStep2<$FLAT_k$, $B_{kg}=B_{kg}$+rampStep2; else, $B_{kg}=FLAT_k$; where $FLAT_k$ is the second value, $B_{kg}$ is a gain of the bypass branch of the $k_{th}$-stage filter, and rampStep2 is a step size of the linearly changing.

Optionally, the linearly changing the current gain of the filter branch of the $k_{th}$-stage filter from the first value to the first target value in the target parameter preset set, includes: linearly changing the current gain of the filter branch of the $k_{th}$-stage filter from the first value to the first target value in the target parameter preset set, through the following determination process: if $F_{kg}$−rampStep3>$F_{kg|target}$, $F_{kg}=F_{kg}$−rampStep3; else if, $F_{kg}$+rampStep3<$F_{kg|target}$, $F_{kg}=F_{kg}$+rampStep3; else, $F_{kg}=F_{kg|target}$; where $F_{kg|target}$ is the first target value in the target parameter preset set, $F_{kg}$ is a gain of the filter branch of the $k_{th}$-stage filter, and rampStep3 is a step size of the linearly changing.

Optionally, the linearly changing the current gain of the bypass branch of the $k_{th}$-stage filter from the second value to the second target value in the target parameter preset set, includes: linearly changing the current gain of the bypass branch of the $k_{th}$-stage filter from the second value to the second target value in the target parameter preset set, through the following determination process: if $B_{kg}$−rampStep4>$B_{kg|target}$, $B_{kg}=B_{kg}$−rampStep4; else if, in the case that $B_{kg}$+rampStep4<$B_{kg|target}$, $B_{kg}=B_{kg}$+rampStep4; else, $B_{kg}=B_{kg|target}$; where $B_{kg|target}$ is the second target value in the target parameter preset set, $B_{kg}$ is a gain of the bypass branch of the $k_{th}$-stage filter, and rampStep4 is a step size of the linearly changing.

Optionally, the linearly increasing and/or linearly decreasing the part of parameters in the current parameter preset set, includes: linearly increasing and/or linearly decreasing all parameters of the $k_{th}$-stage filter of the audio equalizer in the current parameter preset set.

Optionally, in the current parameter preset set, in the case that currValue is not equal to targetValue, currValue−rampStep>targetValue, and var=currValue−rampStep; in the case that currValue+rampStep<targetValue, var=currValue+rampStep; else, var=targetValue; where currValue is a current parameter of the $k_{th}$-stage filter of the audio equalizer, var is the parameter processed linearly, targetValue is the target parameter, and rampStep is a step size of the linearly increasing or linearly decreasing.

An audio signal playing method of an audio equalizer is further provided in the present disclosure, including: acquiring a switching instruction of a parameter preset set of the audio equalizer during a process of playing an audio signal; acquiring a predetermined target parameter preset set of the audio equalizer in response to the switching instruction; linearly processing at least a part of parameters in a current parameter preset set in the process of playing the audio signal, to obtain parameters processed linearly; and in the case that the parameters processed linearly are identical to target parameters in the target parameter preset set, playing the audio signal based on the target parameters.

Optionally, the linearly processing at least a part of parameters in the current parameter preset set, includes: linearly increasing and/or linearly decreasing the part of parameters in the current parameter preset set, to obtain the parameters processed linearly.

Optionally, the linearly increasing and/or linearly decreasing the part of parameters in the current parameter preset set to obtain the parameters processed linearly, includes: linearly changing a current gain of a filter branch of a $k_{th}$-stage filter of the audio equalizer in the current parameter preset set to a first value, and linearly changing a current gain of a bypass branch of the $k_{th}$-stage filter of the audio equalizer of the current parameter preset set to a second value; replacing an all-pass filter factor of the $k_{th}$-stage filter in the current parameter preset set with a target all-pass filter factor in the target parameter preset set; and linearly changing the current gain of the filter branch of the $k_{th}$-stage filter from the first value to a first target value in the target parameter preset set, and linearly changing the current gain of the bypass branch of the $k_{th}$-stage filter from the second value to a second target value in the target parameter preset set, where k=1, . . . , R, R is a total number of stages of low-orders filters of the audio equalizer.

Optionally, the linearly increasing and/or linearly decreasing the part of parameters in the current parameter preset set to obtain the parameters processed linearly, includes: linearly increasing and/or linearly decreasing all parameters of the $k_{th}$-stage filter of the audio equalizer in the current parameter preset set, to obtain the parameters processed linearly.

A parameter processing device of an audio equalizer is further provided in the present disclosure, including: an acquisition module, configured to acquire a current parameter preset set and a predetermined target parameter preset set of the audio equalizer; a processing module, configured to linearly process at least a part of parameters in the current parameter preset set, to enable the parameters processed linearly to be identical to target parameters in the target parameter preset set.

Optionally, the processing module is further configured to linearly increase and/or linearly decrease the part of parameters in the current parameter preset set, to enable the parameters processed linearly to be identical to the target parameters in the target parameter preset set.

Optionally, the processing module includes: a first processing unit, configured to linearly change a current gain of a filter branch of a $k_{th}$-stage filter of the audio equalizer in the current parameter preset set to a first value, and linearly change a current gain of a bypass branch of the $k_{th}$-stage filter of the audio equalizer of the current parameter preset set to a second value; a second processing unit, configured to replace an all-pass filter factor of the $k_{th}$-stage filter in the current parameter preset set with a target all-pass filter factor in the target parameter preset set; and a third processing unit, configured to linearly change the current gain of the filter branch of the $k_{th}$-stage filter from the first value to a first target value in the target parameter preset set, and linearly change the current gain of the bypass branch of the $k_{th}$-stage filter from the second value to a second target value in the target parameter preset set, where k=1, 2, . . . , R, R is a total number of stages of low-orders filters of the audio equalizer.

Optionally, the processing module is further configured to linearly increase and/or linearly decrease all parameters of the $k_{th}$-stage filter of the audio equalizer in the current parameter preset set, to enable the parameters processed linearly to be identical to the target parameters in the target parameter preset set.

An audio equalizer is further provided in the present disclosure, including a processor and a memory connected to the processor via a bus interface, where the memory is configured to store a current parameter preset set and a predetermined target parameter preset set of the audio equalizer and store a program and data for the operation of the processor, and the processor is configured to read the program and data stored in the memory to implement modules including: an acquisition module, configured to acquire a current parameter preset set and a predetermined target parameter preset set of the audio equalizer; a processing module, configured to linearly process at least a part of parameters in the current parameter preset set, to enable the parameters processed linearly to be identical to target parameters in the target parameter preset set.

Optionally, the audio equalizer further includes: a controller connected to the processor via the bus interface, configured to acquire a switching instruction of a parameter preset set of the audio equalizer during a process of playing an audio signal, enable the processor to linearly process at least a part of current parameters in a current parameter preset set in response to the switching instruction in the process of playing the audio signal to enable the parameters processed linearly to be identical to target parameters in the target parameter preset set, and control a playing of the audio signal based on the target parameters.

According to the present disclosure, the current parameter preset set and the predetermined target parameter preset set of the audio equalizer are acquired, at least a part of parameters in the current parameter preset set is linearly processed to enable the parameters processed linearly to be identical to the target parameters in the target parameter preset set, and the audio signal is played based on the target parameters, so as to avoid a noise sound like "Click" caused in the case of replacing the parameters in the current parameter preset set directly with the target parameters in the predetermined target parameter preset set, thereby improving the user experience.

DETAILED DESCRIPTION OF THE EMBODIMENTS

In order to make the objects, the technical solutions and the advantages of the present disclosure more apparent, the present disclosure will be described hereinafter in a clear and complete manner in conjunction with the drawings and embodiments.

In view of the technical issue in the related art that a noise sound like "Click" may occur when switching the preset set of AEQ during the audio equalizer playing the audio signal and the noise makes the user uncomfortable, the present disclosure provides a parameter processing method, an audio signal playing method and device of an audio equalizer, and an audio equalizer.

Embodiment I

Figure 3:
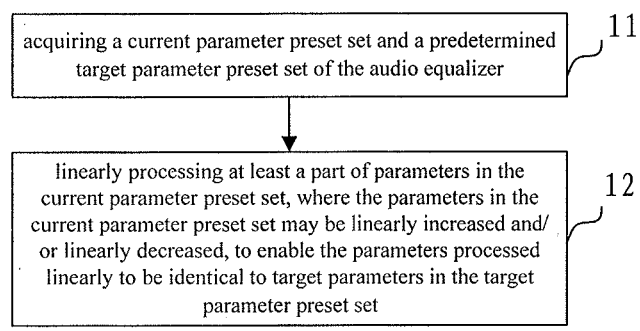
FIG. 3 is a flow chart of a parameter processing method of an audio equalizer.

As shown in FIG. 3, a parameter processing method of an audio equalizer is provided in some embodiment of the present disclosure, including:

Step 11: acquiring a current parameter preset set and a predetermined target parameter preset set of the audio equalizer;

Step 12: linearly processing at least a part of parameters in the current parameter preset set, where the parameters in the current parameter preset set may be linearly increased and/or linearly decreased, to obtain the parameters processed linearly, and enable the parameters processed linearly to be identical to target parameters in the target parameter preset set.

According to at least one embodiment of the present disclosure, the current parameter preset set and the predetermined target parameter preset set of the audio equalizer are acquired, at least a part of parameters in the current parameter preset set is linearly processed to enable the parameters processed linearly to be identical to the target parameters in the target parameter preset set, and the audio signal is played based on the target parameters, so as to avoid a noise sound like "Click" caused in the case of replacing the parameters in the current parameter preset set directly with the target parameters in the predetermined target parameter preset set, thereby improving the user experience.

Embodiment II

A parameter processing method of an audio equalizer is provided in some embodiments of the present disclosure, including:

Step 21: acquiring a current parameter preset set and a predetermined target parameter preset set of the audio equalizer;

Step 22: linearly changing (i.e., ramping down) a current gain of a filter branch of a $k_{th}$-stage filter of the audio equalizer in the current parameter preset set to a first value, and linearly changing (i.e., ramping down) a current gain of a bypass branch of the $k_{th}$-stage filter of the audio equalizer of the current parameter preset set to a second value;

Step 23: replacing an all-pass filter factor of the $k_{th}$ stage filter in the current parameter preset set with a target all-pass filter factor in the target parameter preset set;

Step 24: linearly changing (i.e., ramping up) the current gain of the filter branch of the $k_{th}$-stage filter from the first value to a first target value in the target parameter preset set, and linearly changing (i.e., ramping up) the current gain of the bypass branch of the $k_{th}$-stage filter from the second value to a second target value in the target parameter preset set, where k=1, 2, ..., R, R is a total number of stages of low-orders filters of the audio equalizer.

Figure 1:
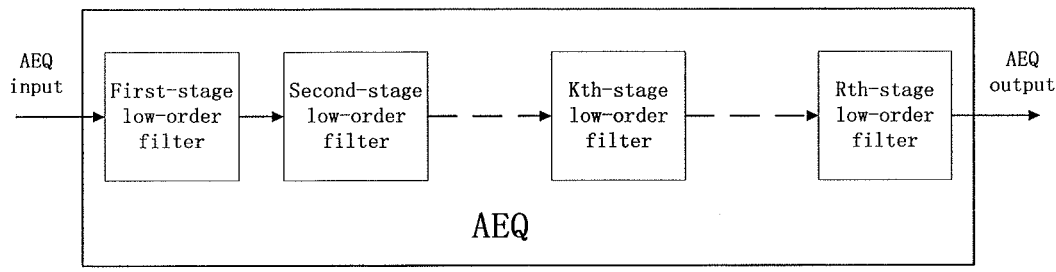
FIG. 1 is a schematic view of an audio equalizer.
Figure 2:
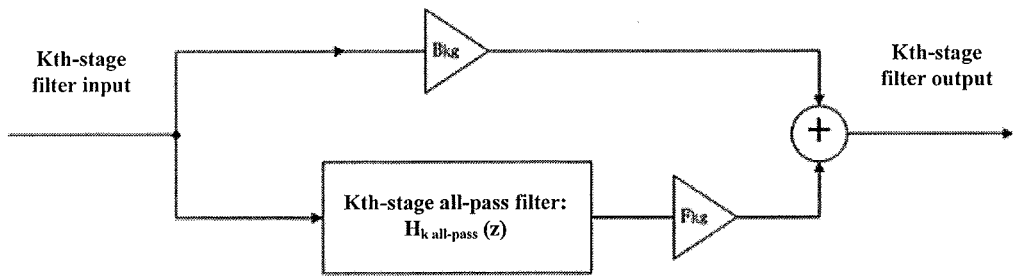
FIG. 2 is a schematic view of an audio equalizer of which a $k_{th}$-stage filter is constituted based an all-pass filter.

In some embodiments of the present disclosure, in the case that every orders of filters of the audio equalizer consist of the all-pass filter shown in FIG. 2, a transfer function of the filter may be represented as:

$$H_k = \begin{cases} F_{kg} \cdot \frac{a_{k0} + a_{k1} \cdot z^{-1} + z^{-2}}{1 + a_{k1} \cdot z^{-1} + a_{k0} \cdot z^{-2}} + B_{kg}, & \text{in the case that } a_{k0} \neq 0 \\ F_{kg} \cdot \frac{a_{k1} + z^{-1}}{1 + a_{k1} \cdot z^{-1}} + B_{kg}, & \text{in the case that } a_{k0} = 0 \end{cases}$$

During playing the audio signal, the switching of the parameter preset set of AEQ is equivalent to applying a Ramping function to the audio signal being played.

Figure 4:
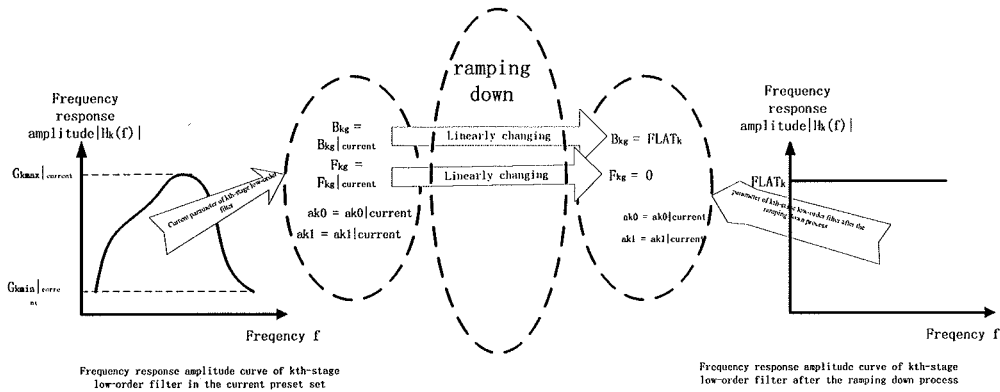
FIG. 4 is a schematic view of frequency response curves of the filter before linearly changing (ramping down) gains of the filter branch and bypass branch of the filter and after the linearly changing in the case that the filter of the audio equalizer is constituted based on an all-pass filter according to method shown in FIG. 3.

In the filter shown in FIG. 2, for the $k_{th}$-stage filter, as shown in FIG. 4, firstly the current gain $F_{kg|current}$ of the filter branch of the $k_{th}$-stage filter is ramped down to 0, i.e., the first value is 0, and then the current gain $B_{kg|current}$ of the bypass branch of the $k_{th}$-stage filter is ramped down to a predetermined parameter level $FLAT_k$, the above process is called a "ramping down process".

Figure 5:
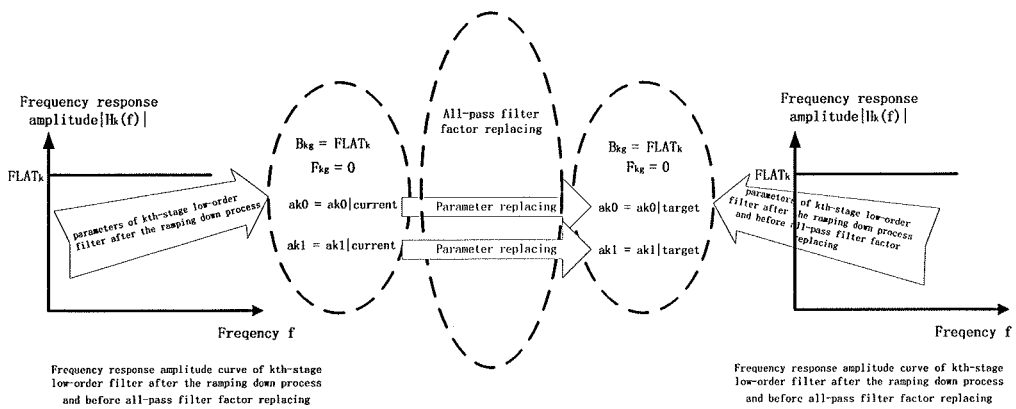
FIG. 5 is a schematic view of frequency response curves of the filter before and after replacing the all-pass filter factors after the ramping down process of the filter in the case that the filter of the audio equalizer is constituted based on an all-pass filter according to method shown in FIG. 3, where the all-pass filter factors are replaced with the target all-pass filter factors.

Then, as shown in FIG. 5, a current all-pass filter factor $\{a_{k0}, a_{k1}\}|_{current}$ (or $\{a_{k1}\}|_{current}$, in the case that $a_{k0}=0$) of the $k_{th}$-stage filter is replaced with an all-pass filter factor $\{a_{k0}, a_{k1}\}|_{target}$ (or $\{a_{k1}\}$target, in the case that $a_{k0}=0$) in the target parameter preset set. The above process is called a "filter parameter replacing process".

Figure 6:
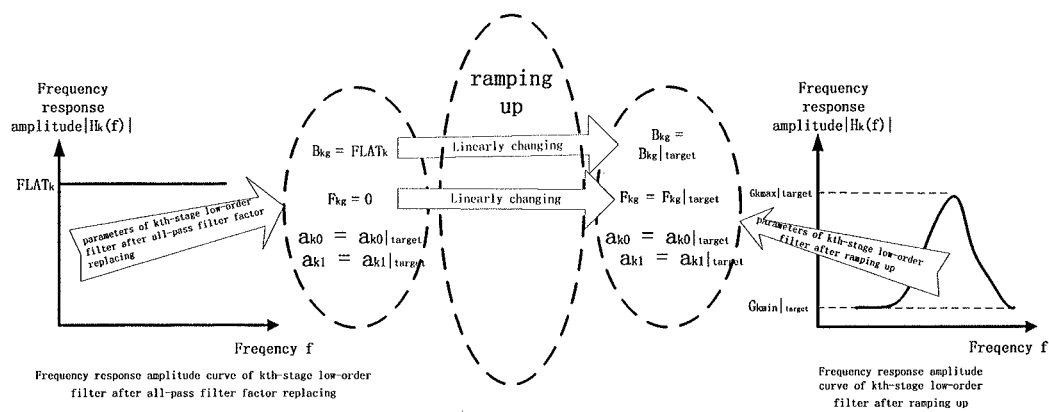
FIG. 6 is a schematic view of frequency response curves of the filter before linearly changing (ramping up) gains of the filter branch and bypass branch of the filter and after the linearly changing in the case that the filter of the audio equalizer is constituted based on an all-pass filter according to method shown in FIG. 3.

Finally, as shown in FIG. 6, the gain of the filter branch of the $k_{th}$-stage filter is ramped up from the constant "0" to a $F_{kg|target}$ in the target parameter preset set, and the gain of the bypass branch of the $k_{th}$-stage filter is ramped up from the predetermined parameter level $FLAT_k$ to a $B_{kg|target}$ in the target parameter preset set. The above process is called a "ramping up process".

In the case that the $k_{th}$-stage filter is a first structural filter or a second structural filter, $G_{kmax}=B_{kg}-F_{kg}$ and $G_{kmin}=B_{kg}+F_{kg}$, where the first structural filter is defined as a second-order peaking filter ($a_{k0} \neq 0$), and the second structural filter is defined as a first-order high-pass shelving filter ($a_{k0}=0$).

In the case that the $k_{th}$-stage filter is a third structural filter, $G_{kmax}=B_{kg}+F_{kg}$ and $G_{kmin}=B_{kg}-F_{kg}$, where the third structural filter is defined as a first-order low-pass shelving filter ($a_{k0}=0$), $G_{kmax}$ is a gain of the center frequency point of the $k_{th}$-stage filter, $G_{kmin}$ is a frequency response curve reference gain of the $k_{th}$-stage filter, $F_{kg}$ is a gain of the filter branch of the $k_{th}$-stage filter, and $B_{kg}$ is a gain of the bypass branch of the $k_{th}$-stage filter.

It can be seen from the above, the parameter level $FLAT_k$ is determined based on $G_{kmin}$ which is the frequency response curve reference gain of the $k_{th}$-stage filter and $G_{kmax}$ which is the gain of the center frequency point of the $k_{th}$-stage filter.

For the above filters constituted based on the all-pass filters, in the case that $a_{k0} \neq 0$, a peaking filter is defined. At this time, a gain of a center frequency point of the peaking filter is: $G_{kmax}=B_{kg}-F_{kg}$ (1), and a reference gain of a DC frequency and a Nyquist frequency is: $G_{km}$ in $=B_{kg} F_{kg}$ (2).

In the case that $G_{kmax}>G_{kmin}$, the filter is called a band-pass peaking filter, otherwise it is called a band-stop peaking filter.

In the case that $a_{k0}=0$, a shelving filter is defined.

For a low-pass shelving filter, a gain of a center frequency DC is: $G_{kmax}=B_{kg} F_{kg}$ (3), and a reference gain of the Nyquist frequency is: $G_{kmin}=B_{kg}-F_{kg}$ (4).

For a high-pass shelving filter, a gain of a center frequency is: $G_{kmax}=B_{kg}-F_{kg}$ (5), and a reference gain is: $G_{kmm}=B_{kg}+F_{kg}$ (6).

In that case that the gain of the center frequency and the reference gain of the $k_{th}$-stage filter in the current parameter preset set are $G_{kmax|current}$ and $G_{kmin|current}$ respectively, and the gain of the center frequency and the reference gain of the $k_{th}$-stage filter in the target parameter preset set are $G_{kmax|target}$ and $G_{kmin|target}$ respectively, then the parameter $FLAT_k$ of the second value may be any constant. Optionally, $FLAT_k$ may be determined through the following formula:

$$FLAT_k = \begin{cases} \min[G_{kmax|current}, G_{kmax|target}], & \text{if } G_{kmax|current} > G_{kmin|current} \text{ and} \\ & G_{kmax|target} > G_{kmin|target} \\ \max[G_{kmax|current}, G_{kmax|target}], & \text{otherwise} \end{cases}$$

where $FLAT_k$ is the second value, $G_{kmax|current}$ is a current gain of a center frequency point of the $k_{th}$-stage filter of the audio equalizer, $G_{kmax|target}$ is a target gain of the center frequency point of the $k_{th}$-stage filter of the audio equalizer, $G_{kmin|current}$ is a current frequency response curve reference gain of the $k_{th}$-stage filter of the audio equalizer, and $G_{kmin|target}$ is a target frequency response curve reference gain of the $k_{th}$-stage filter of the audio equalizer.

Embodiment III

A parameter processing method of an audio equalizer is provided in some embodiment of the present disclosure, including:

Step 31: acquiring a current parameter preset set and a predetermined target parameter preset set of the audio equalizer;

Step 32: in the case that $F_{kg}$−rampStep1>0, $F_{kg}=F_{kg}$−rampStep1; otherwise, in the case that $F_{kg}$+rampStep1<0, $F_{kg}=F_{kg}$+rampStep1; otherwise, $F_{kg}=0$; where $F_{kg}$ is a gain of the filter branch of the $k_{th}$-stage filter, and rampStep1 is a step size of the linearly changing (i.e., the ramping down process).

Step 33: in the case that $B_{kg}$−rampStep2>$FLAT_k$, $B_{kg}=B_{kg}$−rampStep2; otherwise, in the case that $B_{kg}$+rampStep2<$FLAT_k$, $B_{kg}=B_{kg}$+rampStep2; otherwise, $B_{kg}=FLAT_k$; where $FLAT_k$ is the second value, $B_{kg}$ is a gain of the bypass branch of the $k_{th}$-stage filter, and rampStep2 is a step size of the linearly changing (i.e., the ramping down process).

Step 34: replacing an all-pass filter factor of the $k_{th}$-stage filter in the current parameter preset set with a target all-pass filter factor in the target parameter preset set.

Step 35: in the case that $F_{kg}$−rampStep3>$F_{kg|target}$, $F_{kg}=F_{kg}$−rampStep3; otherwise, in the case that $F_{kg}$+rampStep3<$F_{kg|target}$, $F_{kg}=F_{kg}$+rampStep3; otherwise, $F_{kg}=F_{kg|target}$; where $F_{kg|target}$ is the first target value in the target parameter preset set, $F_{kg}$ is a gain of the filter branch of the $k_{th}$-stage filter, and rampStep3 is a step size of the linearly changing (i.e., the ramping up process).

Step 36: in the case that $B_{kg}$−rampStep4>$B_{kg|target}$, $B_{kg}=B_{kg}$−rampStep4; otherwise, in the case that $B_{kg}$+rampStep4<$B_{kg|target}$, $B_{kg}=B_{kg}$+rampStep4; otherwise, $B_{kg}=B_{kg|target}$; where $B_{kg|target}$ is the second target value in the target parameter preset set, $B_{kg}$ is a gain of the bypass branch of the $k_{th}$-stage filter, and rampStep4 is a step size of the linearly changing (i.e., the ramping up process).

Figure 7:
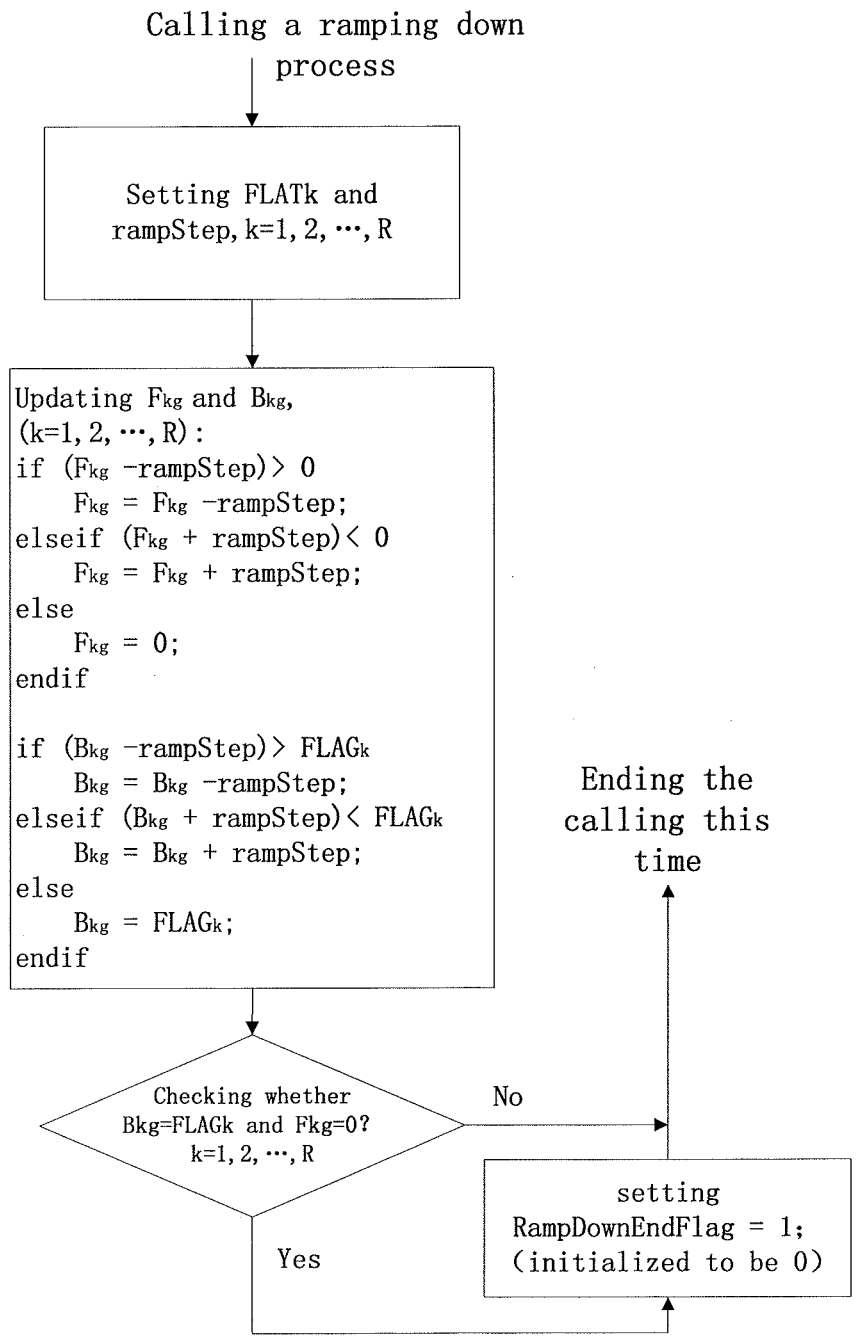
FIG. 7 is a flow chart of a processing algorithm of linearly changing (ramping down) the gains of the filter branch and bypass branch of the filter shown in FIG. 3.

As shown in FIG. 7, Step 32 and Step 33 further include: setting the parameters of the ramping down process including a flat parameter level $FLAT_k$ and step sizes rampStep1 and rampStep2 of the ramping down update, where $k=1, 2, \ldots, R$, R is a total number of stages of low-orders filters of the audio equalizer.

$F_{kg}$ which is the gain of the filter branch of each stage of filter of the current AEQ is updated. To be specific, in the case that $F_{kg}$−rampStep1>0, $F_{kg}=F_{kg}$−rampStep1; otherwise, in the case that $F_{kg}$+rampStep1<0, $F_{kg}=F_{kg}$+rampStep1; otherwise, $F_{kg}=0$.

$B_{kg}$ which is the gain of the bypass branch of each stage of filter of the current AEQ is updated. To be specific, in the case that $B_{kg}$−rampStep2>$FLAT_k$, $B_{kg}=B_{kg}$−rampStep2; otherwise, in the case that $B_{kg}$+rampStep2<$FLAT_k$, $B_{kg}B_{kg}$+rampStep2; otherwise, $B_{kg}=FLAT_k$.

In the case that $F_{kg}=0$ and $B_{kg}=FLAT_k$, an ending flag of the above gain parameter "ramping down" process is set to be "1", to end the call this time.

Figure 8:
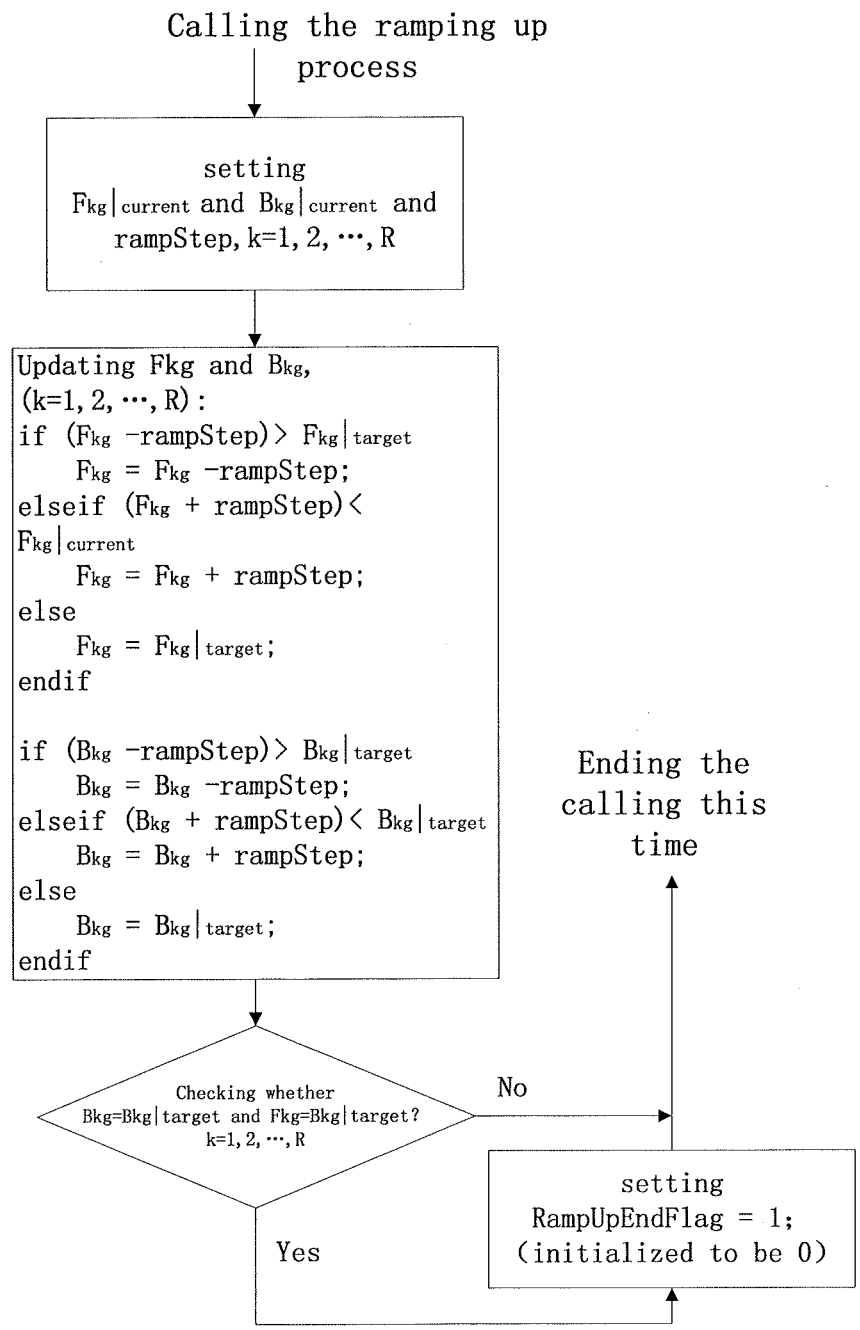
FIG. 8 is a flow chart of a processing algorithm of linearly changing (ramping up) the gains of the filter branch and bypass branch of the filter shown in FIG. 3.

As shown in FIG. 8, Step 35 and Step 36 further include: setting the parameters of the ramping up process including $F_{kg|target}$ and $B_{kg|target}$ and step sizes rampStep3 and rampStep4 of the ramping up update.

$F_{kg}$ which is the gain of the filter branch of each stage of filter of the current AEQ is updated. To be specific, in the case that $F_{kg}$−rampStep3>$F_{kg|target}$, $F_{kg}=F_{kg}$−rampStep3; otherwise, in the case that $F_{kg}$+rampStep3<$F_{kg|target}$, $F_{kg}=F_{kg}$+rampStep3; otherwise, $F_{kg}=F_{kg|target}$.

$B_{kg}$ which is the gain of the bypass branch of each stage of filter of the current AEQ is updated. To be specific, in the case that $B_{kg}$−rampStep4>$B_{kg|target}$, $B_{kg}=B_{kg}$−rampStep4; otherwise, in the case that $B_{kg}$+rampStep4<$B_{kg|target}$, $B_{kg}$−$B_{kg}$+rampStep4; otherwise, $B_{kg}=B_{kg|target}$.

In the case that $F_{kg}=F_{kg|target}$ and $B_{kg}=B_{kg|target}$, an ending flag of the above gain parameter "ramping up" process is set to be "1", to end the call this time.

Embodiment IV

A parameter processing method of an audio equalizer is provided in some embodiment of the present disclosure, including:

Step 41: acquiring a current parameter preset set and a predetermined target parameter preset set of the audio equalizer;

Step 42: linearly increasing and/or linearly decreasing all parameters of the $k_{th}$-stage filter of the audio equalizer in the current parameter preset set, to enable the parameters processed linearly to be identical to the target parameters in the target parameter preset set.

Figure 9:
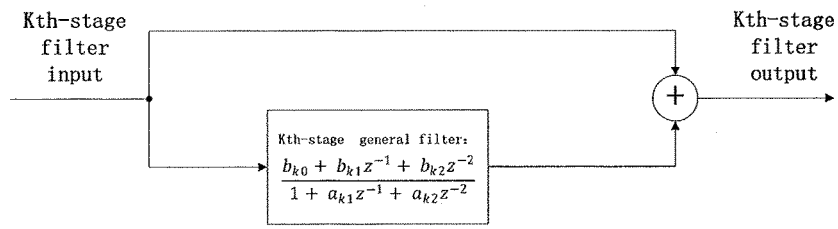
FIG. 9 is a schematic view of an audio equalizer of which a filter is constituted based a general filter.

In some embodiments of the present disclosure, as shown in FIG. 9, the low-order filter $H_k(z)$ is implemented based on the above general structure:

$$H_k(z) = \frac{b_{k0} + b_{k1}z^{-1} + b_{k2}z^{-2}}{1 + a_{k1}z^{-1} + a_{k2}z^{-2}},$$

where the biquad filter is degraded in the case that $b_{k2}=0$ and $a_{k2}=0$ to a double first-order filter $$\frac{b_{k0} + b_{k1}z^{-1}}{1 + a_{k1}z^{-1}}),$$

and then the AEQ predetermined parameter is $\{b_{k0}, b_{k1}, b_{k2}, a_{k1}, a_{k2}, k=1, 2, \ldots, R\}$.

Figure 10:
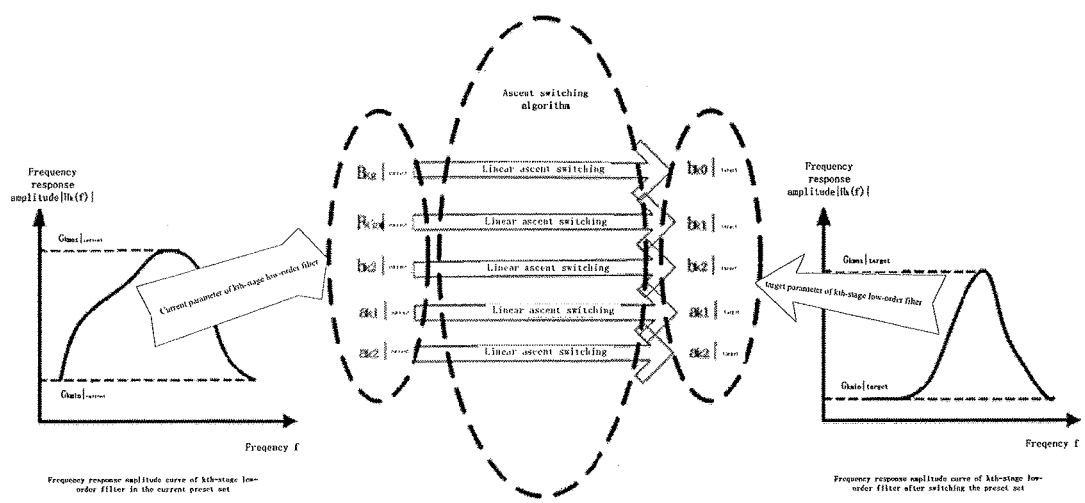
FIG. 10 shows a change of a frequency response curve of the general filter when processing the parameters.
Figure 11:
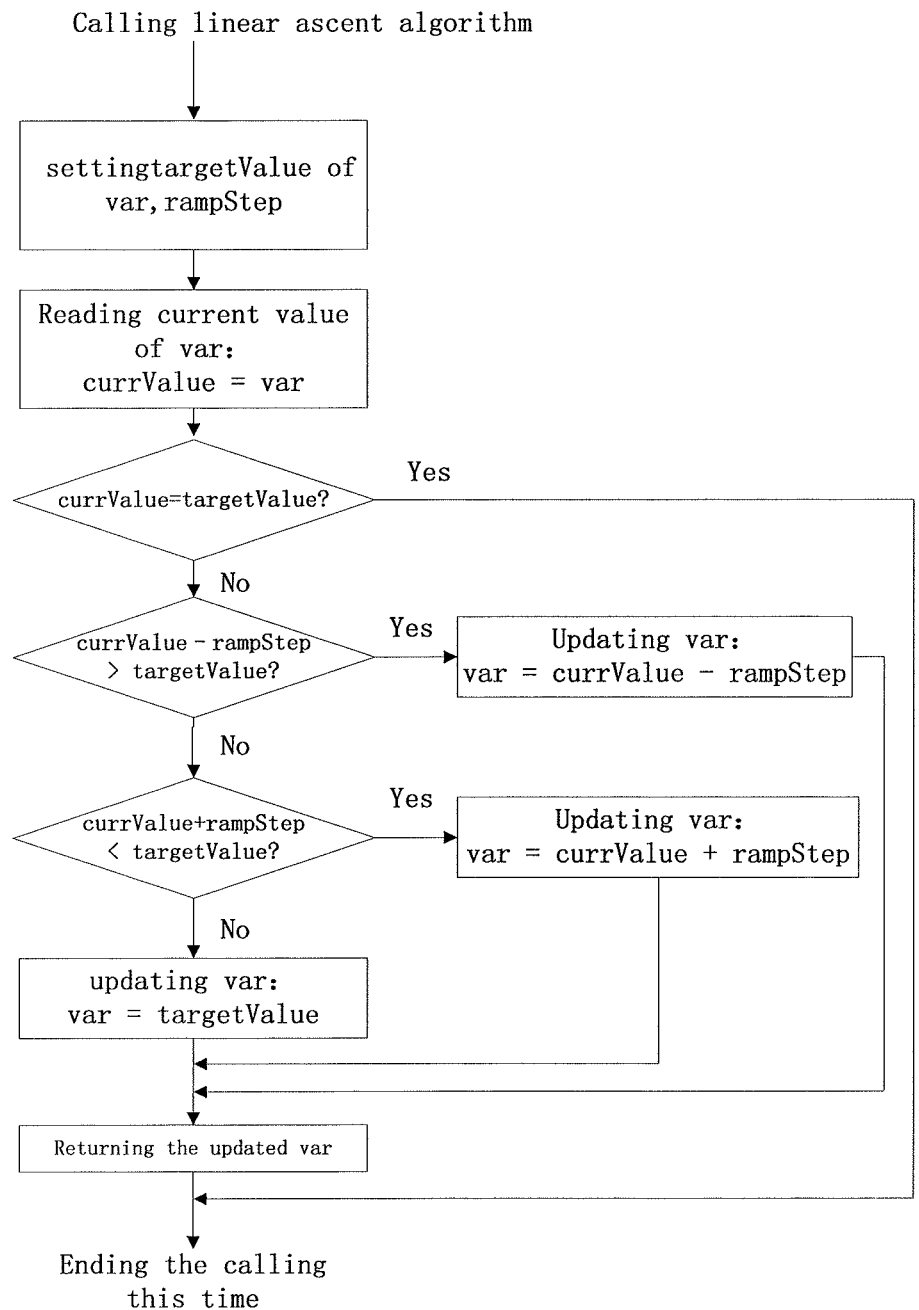
FIG. 11 is a schematic view of an algorithm of processing the parameters of the general filter shown in FIG. 10.
Figure 12:
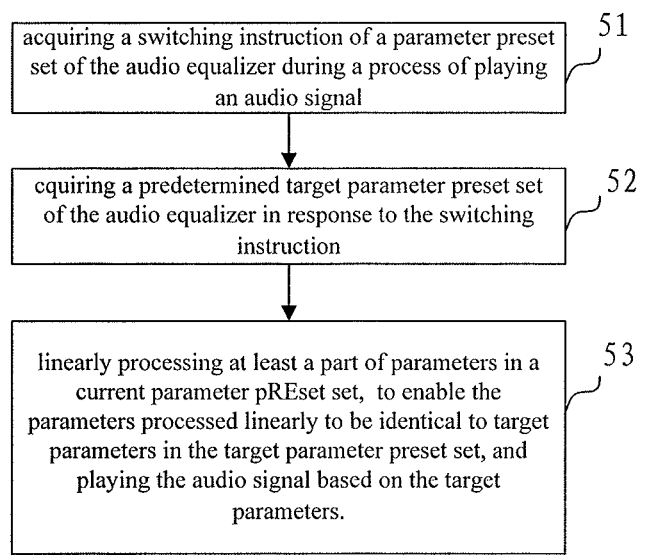
FIG. 12 is a flow chart of an audio signal playing method of an audio equalizer.

In the switching algorithm of the parameter preset set of such filter, a current value of var is set to be curValue, and a target value thereof is set to be targetValue, a step size of the linear ascent algorithm is rampStep, and then a process of calling the linear ascent algorithm for one time to update var is shown in FIG. 10 and FIG. 11.

In the current parameter preset set, in the case that currValue is not equal to targetValue, currValue−rampStep>targetValue, and var=currValue−rampStep; in the case that currValue+rampStep<targetValue, var=currValue+rampStep; otherwise, var=targetValue; where currValue is a current parameter of the $k_{th}$-stage filter of the audio equalizer, var is the parameter processed linearly, targetValue is the target parameter, and rampStep is a step size of the linearly increasing or linearly decreasing.

It can be seen from the above, the completion time of the ramping up or ramping down algorithms is determined based on the calling period parameter rampT of the ascent algorithm and the step size parameter rampStep thereof.

Embodiment V

An audio signal playing method of an audio equalizer is provided in some embodiments of the present disclosure, including:

Step 51: acquiring a switching instruction of a parameter preset set of the audio equalizer during a process of playing an audio signal;

Step 52: acquiring a predetermined target parameter preset set of the audio equalizer in response to the switching instruction;

Step 53: linearly processing at least a part of parameters in a current parameter preset set, to be specific, linearly increasing and/or linearly decreasing all parameters of the $k_{th}$-stage filter of the audio equalizer in the current parameter preset set, to obtain parameters processed linearly, to enable the parameters processed linearly to be identical to target parameters in the target parameter preset set; and playing the audio signal based on the target parameters.

In the case that each order of filter of AEQ consists of an all-pass filter, Step 53 further includes:

Step 531: linearly changing (i.e., ramping down) a current gain of a filter branch of a $k_{th}$-stage filter of the audio equalizer in the current parameter preset set to a first value, and linearly changing (i.e., ramping down) a current gain of a bypass branch of the $k_{th}$-stage filter of the audio equalizer of the current parameter preset set to a second value;

Step 532: replacing an all-pass filter factor of the $k_{th}$-stage filter in the current parameter preset set with a target all-pass filter factor in the target parameter preset set;

Step 533: linearly changing (i.e., ramping up) the current gain of the filter branch of the $k_{th}$-stage filter from the first value to a first target value in the target parameter preset set, and linearly changing (i.e., ramping up) the current gain of the bypass branch of the $k_{th}$-stage filter from the second value to a second target value in the target parameter preset set, where k=1, 2, . . . , R, R is a total number of stages of low-orders filters of the audio equalizer.

In the case that each order of filter of AEQ consists of a general filter, Step 53 further includes: linearly increasing and/or linearly decreasing all parameters of the $k_{th}$-stage filter of the audio equalizer in the current parameter preset set, to enable the parameters processed linearly to be identical to target parameters in the target parameter preset set.

The two filters are provided the above Embodiment II to Embodiment IV, and the detailed description thereof is omitted herein.

Figure 13:
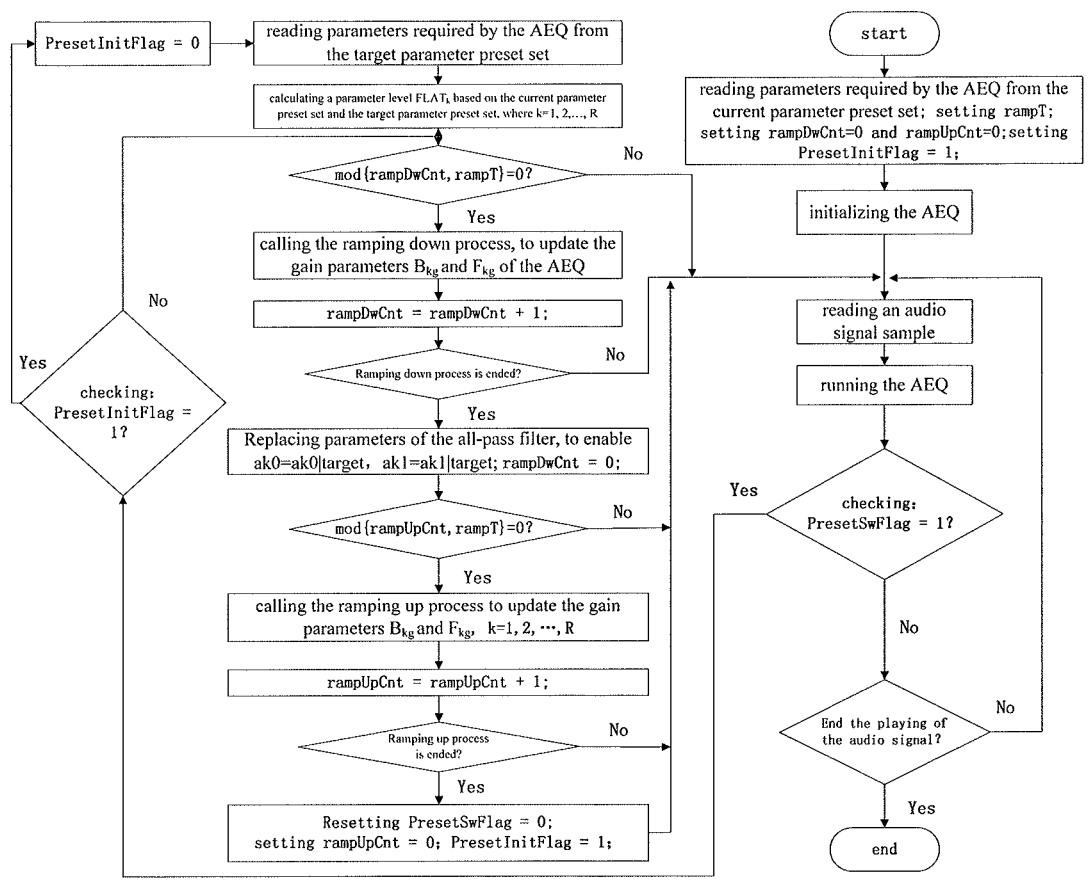
FIG. 13 is a flow chart of an audio signal playing method of an audio equalizer in the case that a filter of the audio equalizer is constituted based on an all-pass filter.

As shown in FIG. 13, in the process of playing the audio signal in the case that each order of filter of the AEQ consists of the all-pass filter, the process of applying the method in Embodiment I to Embodiment IV to perform the parameter switching includes:

reading parameters required by the AEQ from the current parameter preset set, setting a calling period of the ascent algorithm of the parameters linear processing to be rampT, setting a ramping down counter rampDwCnt to be 0 and setting a ramping up counter rampUpCnt to be 0, and setting an initialization flag PreseInitFlag of switching the target preset set parameter to be 1;

initializing the AEQ;
reading an audio signal sample;
running the AEQ;
checking whether a parameter preset set switching flag PresetSwFlag=1; in the case that PresetSwFlag=1, checking whether a target parameter preset set initialization flag PreseInitFlag=1; in the case that PreseInitFlag=1, setting PreseInitFlag to be 0, and reading the parameters required by the AEQ from the target parameter preset set;

calculating a parameter level FLAT; based on the current parameter preset set and the target parameter preset set, where k=1, 2, . . . , R, R is a total number of stages of low-orders filters of the audio equalizer;

determining whether the calling period of the ramping down algorithm is reached, to be specific, determining whether Mod {rampDwCnt,rampT}=0;

in the case that Mod {rampDwCnt,rampT}=0, calling the ramping down process, to update the gain parameters $B_{kg}$ and $F_{kg}$ of the AEQ until the ramping down process is ended.

replacing parameters of the all-pass filter, to enable $a_{k0}=a_{k0|target}$, $a_{k1}=a_{k1|target}$;

in the case of reaching the period of the ramping up process, calling the ramping up process to update the gain parameters $B_{kg}$ and $F_{kg}$ of the AEQ until the ramping up process is ended.

resetting PresetSwFlag to be 0, setting rampUpCnt to be 0, and setting PreseInitFlag to be 1.

Figure 14:
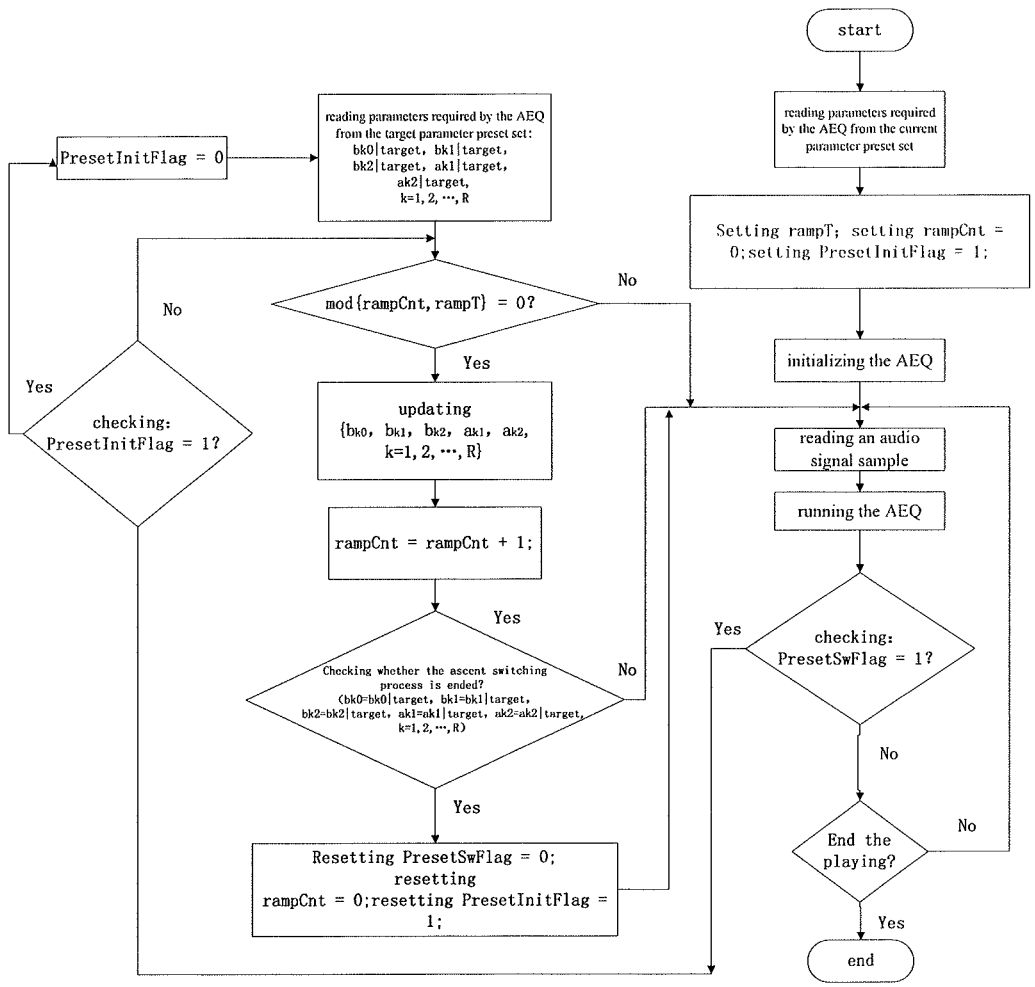
FIG. 14 is a flow chart of an audio signal playing method of an audio equalizer in the case that a filter of the audio equalizer is a general filter.

As shown in FIG. 14, in the process of playing the audio signal in the case that each order of filter of the AEQ consists of the general filter, the process of applying the method in Embodiment I to Embodiment IV to perform the parameter switching includes:

reading parameters required by the AEQ from the current parameter preset set;

setting a calling period of the ascent algorithm of the parameters linear processing to be rampT, setting a calling period of an ascent algorithm to be rampT, and setting an ascent algorithm calling counter rampCnt to be 0, and setting an initialization flag PreseInitFlag of switching to target parameter preset set to be 1;

initializing the AEQ;
reading an audio signal sample;
running the AEQ;
checking whether a parameter preset set switching flag PresetSwFlag=1; in the case that PresetSwFlag=1, checking whether a target parameter preset set initialization flag PreseInitFlag=1; in the case that PreseInitFlag=1, setting PreseInitFlag to be 0, and reading the parameters required by the AEQ from the target parameter preset set, $b_{k0|target}$, $b_{k1|target}$, $b_{k2|target}$, $a_{k1|target}$, $a_{k2|target}$.

determining whether the calling period of the ascent algorithm is reached, to be specific, determining whether Mod {rampCnt, rampT}=0;

in the case that Mod {rampCnt, rampT}=0, calling the ascent algorithm, to update the gain parameters the AEQ $\{b_{k0}, b_{k1}, b_{k2}, a_{k1}, a_{k2}\}$ until $a_{k1}=a_{k0|target}$, $a_{k2}=a_{k1|target}$, $b_{k0}=b_{k0|target}$, $b_{k1}=b_{k1|target}$, $b_{k2}=b_{k2|target}$.

resetting PresetSwFlag to be 0, setting rampUpCnt to be 0, and setting PreseInitFlag to be 1.

Embodiment VI

Figure 15:
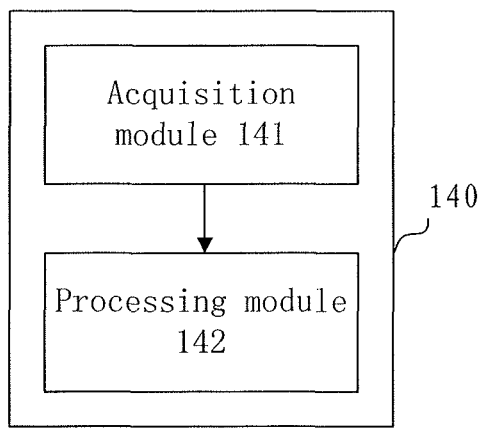
FIG. 15 is a schematic view of a parameter processing device of an audio equalizer.

As shown in FIG. 15, a parameter processing device 140 of an audio equalizer is provided in some embodiments of the present disclosure, including:

an acquisition module 141, configured to acquire a current parameter preset set and a predetermined target parameter preset set of the audio equalizer;

a processing module 142, configured to linearly process at least a part of parameters in the current parameter preset set, to enable the parameters processed linearly to be identical to target parameters in the target parameter preset set, to be specific, linearly increase and/or linearly decrease the part of parameters in the current parameter preset set, to obtain the parameters processed linearly.

The processing module 142 includes:

a first processing unit, configured to ramp down a current gain of a filter branch of a $k_{th}$-stage filter of the audio equalizer in the current parameter preset set to a first value, and ramp down a current gain of a bypass branch of the $k_{th}$-stage filter of the audio equalizer of the current parameter preset set to a second value;

a second processing unit, configured to replace an all-pass filter factor of the $k_{th}$-stage filter in the current parameter preset set with a target all-pass filter factor in the target parameter preset set;

a third processing unit, configured to ramp up the current gain of the filter branch of the $k_{th}$-stage filter from the first value to a first target value in the target parameter preset set, and ramp up the current gain of the bypass branch of the $k_{th}$-stage filter from the second value to a second target value in the target parameter preset set, where k=1, 2, . . . , R, R is a total number of stages of low-orders filters of the audio equalizer; and a fourth processing unit, configured to play the audio signal based on the target parameters in the case that the parameters processed linearly are identical to target parameters in the target parameter preset set.

The processing module is configured to linearly increase and/or linearly decrease all parameters of the $k_{th}$-stage filter of the audio equalizer in the current parameter preset set, to obtain the parameters processed linearly.

It should be noted that, the method provided in the above Embodiment I to IV may be applied to the above parameter processing device.

Embodiment VII

Figure 16:
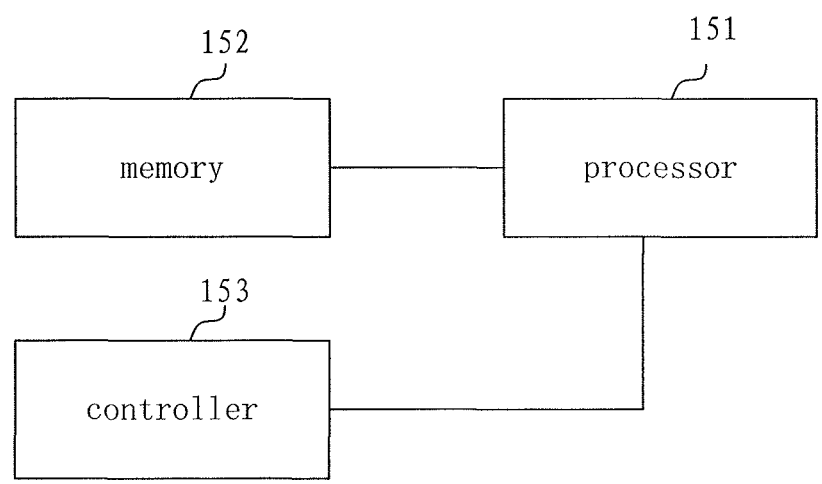
FIG. 16 is a schematic view of an audio equalizer.

As shown in FIG. 16, an audio equalizer is provided in some embodiments of the present disclosure, including:

a processor 151 and a memory 152 connected to the processor 151 via a bus interface, where the memory is configured to store a current parameter preset set and a predetermined target parameter preset set of the audio equalizer and store a program and data for the operation of the processor, and the processor is configured to read the program and data stored in the memory to implement modules including:

an acquisition module, configured to acquire a current parameter preset set and a predetermined target parameter preset set of the audio equalizer; and a processing module, configured to linearly process at least a part of parameters in the current parameter preset set, to enable the parameters processed linearly to be identical to target parameters in the target parameter preset set.

The audio equalizer further includes: a controller connected to the processor via the bus interface, configured to acquire a switching instruction of a parameter preset set of the audio equalizer during a process of playing an audio signal, enable the processor to linearly process at least a part of current parameters in a current parameter preset set in response to the switching instruction in the process of playing the audio signal to enable the parameters processed linearly to be identical to target parameters in the target parameter preset set, and control a playing of the audio signal based on the target parameters.

The method provided in the above Embodiment I to IV may be applied to the above audio equalizer.

According the embodiments of the present disclosure, when needing to switch the AEQ predetermined parameter set during playing the audio signal, the switching scheme needs to comply with the ascent switching algorithm in Embodiment I to Embodiment IV, i.e., the parameters of the AEQ is switched from the current value to the target value based on the "linear ascent algorithm".

For the AEQ realized by the low-order all-pass filter, in the process of switching the preset parameter set thereof, from "gain parameter ramping down" to "filter parameter replacing" to "gain parameter ramping up", the "gain parameter ramping down" process transfers the frequency response of every orders of filters of the AEQ to the parameter level $FLAT_k$ of the "flat mode", which is not limited to the value in the embodiments of the present disclosure and may be any constant.

In the related art, during playing the audio signal, a noise sound like "Click" when switching the parameter preset set of AEQ may occur, and that makes the user uncomfortable. According to the AEQ parameter preset set ascent switching algorithm, the above technical issue in the related art may be avoided, thereby improving the user experience.

The principle of the present disclosure is described in the above embodiments. However, it should be noted that, those skilled in the art may appreciate that any step or component of the method and device of the present disclosure may be implemented by any hardware, software, firmware or the combination thereof in any computer device (including a processor, memory, etc) or computer device network, which may be implemented by those skilled in the art after reading the description based on their own programming skill.

Therefore, the objective of the present disclosure may be achieved by running a program or a group of programs on any computer device which may be a common device. Therefore, the objective of the present disclosure may be achieved by a program product with the program code for implementing the method and device. That is, the present disclosure also includes such program product and a storage medium storing such program product. Obviously, the storage medium may be any common storage medium.

It should be noted that, the step or components in the method and device of the present disclosure may be decomposited and/or recombined, and such decomposition and/or recombination may be the equivalent solution of the present disclosure. In addition, the steps of the above processing may be performed not performed in a chronological order, and certain steps may be performed in parallel or independently.

The above embodiments do not limit the scope of the present disclosure. A person skilled in the art may make further modifications and improvements without departing from the spirit of the present disclosure, and these modifications and improvements shall also fall within the scope of the present disclosure.

The above are merely the preferred embodiments of the present disclosure, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A parameter processing method of an audio equalizer, comprising:

acquiring a current parameter preset set and a predetermined target parameter preset set of the audio equalizer;

linearly processing at least a part of parameters in the current parameter preset set, to enable the parameters processed linearly to be identical to target parameters in the target parameter preset set;

wherein the linearly processing at least a part of parameters in the current parameter preset set, comprises:

linearly increasing and/or linearly decreasing the part of parameters in the current parameter preset set, to enable the parameters processed linearly to be identical to the target parameters in the target parameter reset set;

wherein the linearly increasing and/or linearly decreasing the part of parameters in the current parameter preset set, to enable the parameters processed linearly to be identical to the target parameters in the target parameter preset set, comprises:

linearly changing a current pain of a filter branch of a $k_{th}$-stage filter of the audio equalizer in the current parameter preset set to a first value, and linearly changing a current gain of a bypass branch of the $k_{th}$-stage filter of the audio equalizer of the current parameter reset set to a second value;

replacing an all-pass filter factor of the $k_{th}$-stage filter in the current parameter preset set with a target all-pass filter factor in the target parameter preset set; and linearly changing the current gain of the filter branch of the $k_{th}$-stage filter from the first value to a first target value in the target parameter preset set, and linearly changing the current gain of the bypass branch of the $k_{th}$-stage filter from the second value to a second target value in the target parameter preset set, wherein k=1, 2, ..., R, R is a total number of stages of low-orders filters of the audio equalizer.

2. The method according to claim 1, wherein the first value is 0.

3. The method according to claim 2, wherein the linearly changing the current gain of the filter branch of the $k_{th}$-stage filter of the audio equalizer in the current parameter preset set to the first value, comprises:

linearly changing the current gain of the filter branch of the $k_{th}$-stage filter of the audio equalizer to the first value, through the following determination process:

in the case that $F_{kg}$−rampStep1>0, $F_{kg}=F_{kg}$−rampStep1; otherwise, in the case that $F_{kg}$+rampStep1<0, $F_{kg}-F_{kg}$+rampStep1; otherwise, $F_{kg}=0$;

wherein $F_{kg}$ is a gain of the filter branch of the $k_{th}$-stage filter, and rampStep1 is a step size of the linearly changing.

4. The method according to claim 1, wherein the second value is an arbitrary constant.

5. The method according to claim 1, wherein the second value is obtained through the following formula:

$$FLAT_k = \begin{cases} \min[G_{kmax|current}, G_{kmax|target}], & \text{if } G_{kmax|current} > G_{kmin|current} \text{ and } G_{kmax|target} > G_{kmin|target} \\ \max[G_{kmax|current}, G_{kmax|target}], & \text{otherwise} \end{cases}$$

wherein $FLAT_k$ is the second value, $G_{kmax|current}$ is a current gain of a center frequency point of the $k_{th}$-stage filter of the audio equalizer, $G_{kmax|target}$ is a target gain of the center frequency point of the $k_{th}$-stage filter of the audio equalizer, $G_{kmin|current}$ is a current frequency response curve reference gain of the $k_{th}$-stage filter of the audio equalizer, and $G_{kmin|target}$ is a target frequency response curve reference gain of the $k_{th}$-stage filter of the audio equalizer.

6. The method according to claim 5, wherein in the case that the $k_{th}$-stage filter is a first structural filter or a second structural filter, $G_{kmax}=B_{kg}-F_{kg}$ and $G_{kmin}=B_{kg}+F_{kg}$; or in the case that the $k_{th}$-stage filter is a third structural filter, $G_{kmax}=B_{kg}+F_{kg}$ and $G_{kmin}=B_{kg}-F_{kg}$; wherein $G_{kmax}$ is a gain of the center frequency point of the $k_{th}$-stage filter, $G_{kmin}$ is a frequency response curve reference gain of the $k_{th}$-stage filter, $F_{kg}$ is a gain of the filter branch of the $k_{th}$-stage filter, and $B_{kg}$ is a gain of the bypass branch of the $k_{th}$-stage filter.

7. The method according to claim 1, wherein the linearly changing the current gain of the bypass branch of the $k_{th}$-stage filter to the second value, comprises:

linearly changing the current gain of the bypass branch of the $k_{th}$-stage filter to the second value, through the following determination process:

in the case that $B_{kg}$−rampStep2>$FLAT_k$, $B_{kg}=B_{kg}$−rampStep2; otherwise, in the case that $B_{kg}$+rampStep2<$FLAT_k$, $B_{kg}=B_{kg}$+rampStep2; otherwise, $B_{kg}=FLAT_k$;

wherein $FLAT_k$ is the second value, $B_{kg}$ is a gain of the bypass branch of the $k_{th}$-stage filter, and rampStep2 is a step size of the linearly changing.

8. The method according to claim 1, wherein the linearly changing the current gain of the filter branch of the $k_{th}$-stage filter from the first value to the first target value in the target parameter preset set, comprises:

linearly changing the current gain of the filter branch of the $k_{th}$-stage filter from the first value to the first target value in the target parameter preset set, through the following determination process:

in the case that $F_{kg}$−rampStep3>$F_{kg|target}$, $F_{kg}=F_{kg}$−rampStep3; otherwise, in the case that $F_{kg}$+rampStep3<$F_{kg|target}$, $F_{kg}=F_{kg}$+rampStep3; otherwise, $F_{kg}=F_{kg|target}$;

wherein $F_{kg|target}$ is the first target value in the target parameter preset set, $F_{kg}$ is a gain of the filter branch of the $k_{th}$-stage filter, and rampStep3 is a step size of the linearly changing.

9. The method according to claim 1, wherein the linearly changing the current gain of the bypass branch of the $k_{th}$-stage filter from the second value to the second target value in the target parameter preset set, comprises:

linearly changing the current gain of the bypass branch of the $k_{th}$-stage filter from the second value to the second target value in the target parameter preset set, through the following determination process:

in the case that $B_{kg}$−rampStep4>$B_{kg|target}$, $B_{kg}=B_{kg}$−rampStep4; otherwise, in the case that $B_{kg}$+rampStep4<$B_{kg|target}$, $B_{kg}=B_{kg}$+rampStep4; otherwise, $B_{kg}=B_{kg|target}$;

wherein $B_{kg|target}$ is the second target value in the target parameter preset set, $B_{kg}$ is a gain of the bypass branch of the $k_{th}$-stage filter, and rampStep4 is a step size of the linearly changing.

10. The method according to claim 1, wherein the linearly increasing and/or linearly decreasing the part of parameters in the current parameter preset set, comprises:

linearly increasing and/or linearly decreasing all parameters of a $k_{th}$-stage filter of the audio equalizer in the current parameter preset set.

11. The method according to claim 10, wherein in the current parameter preset set, in the case that currValue is not equal to targetValue, currValue−rampStep>targetValue, and var=currValue−rampStep; in the case that currValue+rampStep<targetValue, var=currValue+rampStep; otherwise, var=targetValue;

wherein currValue is a current parameter of the $k_{th}$-stage filter of the audio equalizer, var is the parameter processed linearly, targetValue is the target parameter, and rampStep is a step size of the linearly increasing or linearly decreasing.

12. An audio signal playing method of an audio equalizer, comprising:
    acquiring a switching instruction of a parameter preset set of the audio equalizer during a process of playing an audio signal;
    acquiring a predetermined target parameter preset set of the audio equalizer in response to the switching instruction;
    linearly processing at least a part of parameters in a current parameter preset set in the process of playing the audio signal, to obtain parameters processed linearly; and
    in the case that the parameters processed linearly are identical to target parameters in the target parameter preset set, playing the audio signal based on the target parameters;
    wherein the linearly processing at least a part of parameters in the current parameter preset set, comprises:
    linearly increasing and/or linearly decreasing the part of parameters in the current parameter preset set, to obtain the parameters processed linearly;
    wherein the linearly increasing and/or linearly decreasing the part of parameters in the current parameter preset set to obtain the parameters processed linearly, comprises:
    linearly changing a current gain of a filter branch of a $k_{th}$-stage filter of the audio equalizer in the current parameter preset set to a first value, and linearly changing a current gain of a bypass branch of the $k_{th}$-stage filter of the audio equalizer of the current parameter preset set to a second value;
    replacing an all-pass filter factor of the k_-stage filter in the current parameter preset set with a target all-pass filter factor in the target parameter preset set; and
    linearly changing the current pain of the filter branch of the $k_{th}$-stage filter from the first value to a first target value in the target parameter preset set, and linearly changing the current gain of the bypass branch of the $k_{th}$-stage filter from the second value to a second target value in the target parameter preset set, wherein k=1, 2, . . . , R, R is a total number of stages of low-orders filters of the audio equalizer.

13. The method according to claim 12, wherein the linearly increasing and/or linearly decreasing the part of parameters in the current parameter preset set to obtain the parameters processed linearly, comprises:
    linearly increasing and/or linearly decreasing all parameters of the $k_{th}$-stage filter of the audio equalizer in the current parameter preset set, to obtain the parameters processed linearly.

14. A parameter processing device of an audio equalizer, comprising a processor, a transceiver and a memory, wherein the processor is configured to read a program stored in the memory to:
    acquire a current parameter preset set and a predetermined target parameter preset set of the audio equalizer,
    linearly process at least a part of parameters in the current parameter preset set, to enable the parameters processed linearly to be identical to target parameters in the target parameter preset set;
    the transceiver is configured to receive and transmit data;
    the processor is configured to manage a bus architecture and perform a general processing; and
    the memory is configured to store data for the operation of the processor;
    wherein the processor is further configured to read a program stored in the memory to linearly increase and/or linearly decrease the part of parameters in the current parameter preset set, to enable the parameters processed linearly to be identical to the target parameters in the target parameter preset set;
    wherein the processing module is further configured to:
    linearly change a current gain of a filter branch of a $k_{th}$-stage filter of the audio equalizer in the current parameter preset set to a first value, and linearly change a current gain of a bypass branch of the $k_{th}$-stage filter of the audio equalizer of the current parameter preset set to a second value;
    replace an all-pass filter factor of the $k_{th}$-stage filter in the current parameter preset set with a target all-pass filter factor in the target parameter preset set; and
    linearly change the current pain of the filter branch of the $k_{th}$-stage filter from the first value to a first target value in the target parameter preset set, and linearly change the current gain of the bypass branch of the $k_{th}$-stage filter from the second value to a second target value in the target parameter preset set, wherein k=1, 2, . . . , R, R is a total number of stages of low-orders filters of the audio equalizer.

* * * * *